United States Patent
Nakayama et al.

(10) Patent No.: US 9,516,778 B2
(45) Date of Patent: Dec. 6, 2016

(54) ELECTRONIC DEVICE AND INSERTION ERROR PROTECTION DEVICE

(71) Applicant: FUJITSU LIMITED, Kawasaki-shi, Kanagawa (JP)

(72) Inventors: Akira Nakayama, Kawasaki (JP); Kenji Toshimitsu, Sagamihara (JP); Tsutomu Takahashi, Yokohama (JP); Toshihide Inaba, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/836,567

(22) Filed: Aug. 26, 2015

(65) Prior Publication Data

US 2016/0073538 A1  Mar. 10, 2016

(30) Foreign Application Priority Data

Sep. 4, 2014  (JP) ................................ 2014-180433

(51) Int. Cl.
*H05K 5/00* (2006.01)
*H05K 7/14* (2006.01)

(52) U.S. Cl.
CPC .......... *H05K 7/1455* (2013.01); *H05K 7/1424* (2013.01)

(58) Field of Classification Search
CPC .. H05K 7/1417; H05K 7/1402; H05K 7/1427; G06F 11/10; G11C 5/005; H03K 3/0375; G11B 20/18; B21D 28/00; B21D 28/36
USPC ........................................ 361/728–730, 759
See application file for complete search history.

(56) References Cited

U.S. PATENT DOCUMENTS

| | | | | |
|---|---|---|---|---|
| 6,415,397 B1* | 7/2002 | Co | ......................... | G01R 31/01 714/42 |
| 6,693,816 B2* | 2/2004 | Brunelle | ............ | G01R 31/2886 324/756.02 |
| 7,365,964 B2* | 4/2008 | Donahue, IV | ....... | H01R 13/514 174/50 |
| 8,934,260 B2* | 1/2015 | Tanaka | .................... | G06F 1/184 361/737 |
| 2012/0311379 A1* | 12/2012 | Moyer | .................. | G06F 11/073 714/6.11 |
| 2013/0221976 A1* | 8/2013 | Blumschein | ......... | G01R 31/025 324/509 |

FOREIGN PATENT DOCUMENTS

| | | |
|---|---|---|
| JP | 62-201991 | 12/1987 |
| JP | 3-41990 | 4/1991 |
| JP | 7-29889 | 6/1995 |

* cited by examiner

*Primary Examiner* — Hung S Bui
(74) *Attorney, Agent, or Firm* — Staas & Halsey LLP

(57) ABSTRACT

An electronic device includes: a shelf where a first slot and a second slot are formed; a plurality of kinds of electronic circuit boards including a first-side protrusion portion and a second-side protrusion portion, and an arrangement pattern of the first-side protrusion portion and the second-side protrusion is different from each other; when an electronic circuit board having the first-side protrusion portion into the first slot, the first abutment member abut the first-side protrusion portion of the first position and rotate from a first angle position to a second angle position; a second abutment member installed at the first slot and rotatable around an axis of the first direction, and when an electronic circuit board having the first-side protrusion portion into the first slot, the second abutment member abut the first-side protrusion portion of the second position and rotate from the first angle position to the second angle position.

12 Claims, 23 Drawing Sheets

FIG. 4

|  | FIRST SLOT | | |
|---|---|---|---|
|  | A | B | C |
| A | ○ | ○ | × |
| B | × | × | ○ |
| C | × | ○ | × |

SECOND SLOT

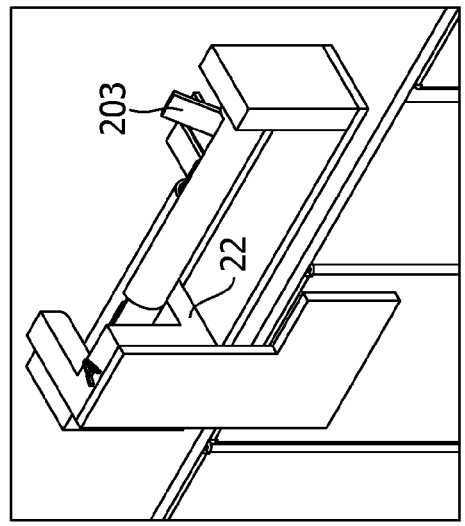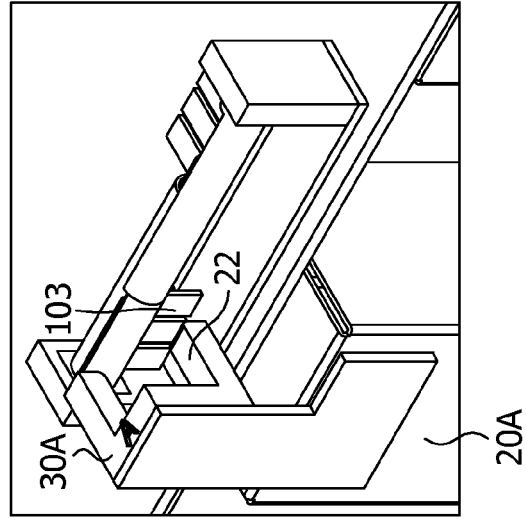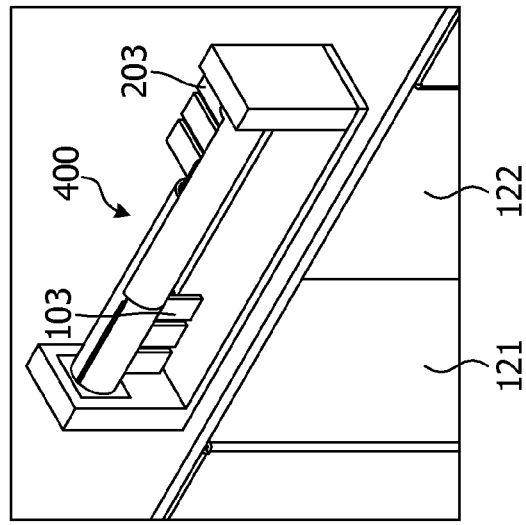

FIG. 6A
FIG. 6B
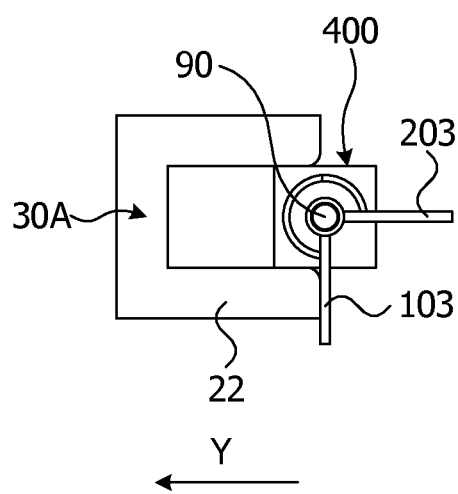
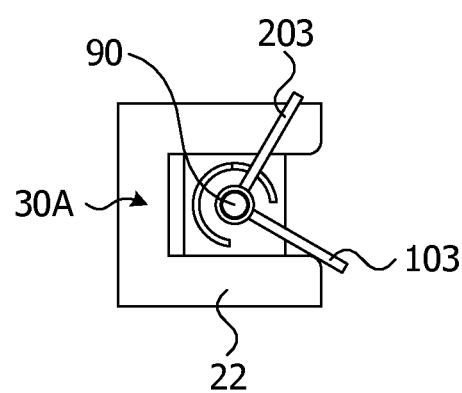

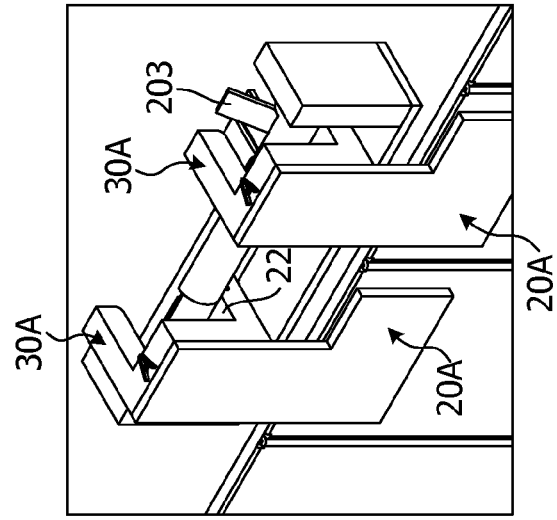
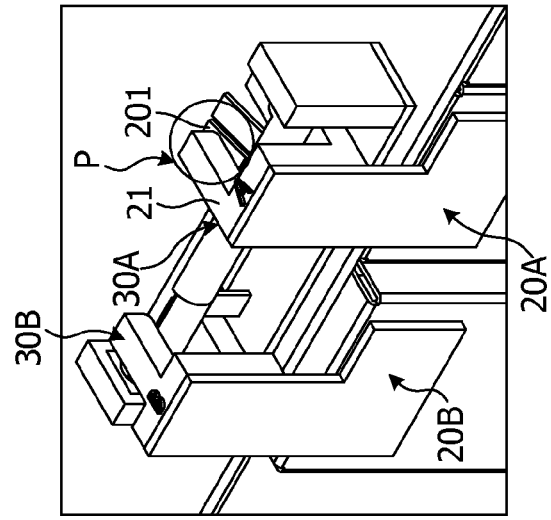
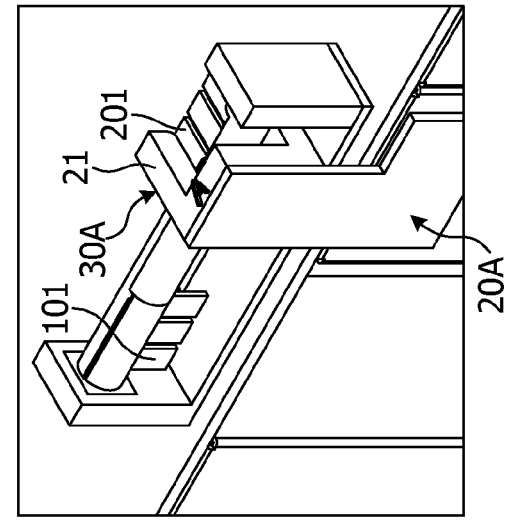

FIG. 9

|  | SECOND SLOT | | |
|---|---|---|---|
|  | A | B | C |
| A | ○ | ○ | × |
| B | ○ | × | ○ |
| C | × | ○ | × |

FIRST SLOT

FIG. 18

|  | SECOND SLOT | | |
|---|---|---|---|
|  | A | B | C |
| A | × | ○ | × |
| B | ○ | × | ○ |
| C | ○ | × | × |

FIRST SLOT

FIG. 22

SECOND,THIRD,FOURTH SLOT

|  | A | B | C |
|---|---|---|---|
| A | ○ | ○ | × |
| B | × | × | ○ |
| C | × | ○ | × |

FIRST SLOT

ELECTRONIC DEVICE AND INSERTION ERROR PROTECTION DEVICE

CROSS-REFERENCE TO RELATED APPLICATION

This application is based upon and claims the benefit of priority of the prior Japanese Patent Application No. 2014-180433 filed on Sep. 4, 2014, the entire contents of which are incorporated herein by reference.

FIELD

The embodiments discussed herein are related to an electronic device and an insertion error protection device.

BACKGROUND

A package insertion error protection structure has been known in which an insertion error protection hardware of U-shaped of which the front end at the left and right or any one side of the front plate installed as a hook shape at the front end of the package is directed towards the inside, and a key home fitting only with the insertion error protection hardware is installed at the front plate of the abutting package.

However, in the package insertion error protection structure described above, the package is to be pulled out in a specific order. For example, when a package is out of order and replaced, all the packages inserted after the broken package should be pulled out.

The following are reference documents.
  [Document 1] Japanese Unexamined Utility Model Registration Application Publication No. H07-29889,
  [Document 2] Japanese Unexamined Utility Model Registration Application Publication No. H03-41990, and
  [Document 3] Japanese Unexamined Utility Model Registration Application Publication No. S62-201991.

SUMMARY

According to an aspect of the invention, an electronic device, includes: a shelf where a first slot and a second slot are formed to be abutted with each other in a first direction; a plural kinds of electronic circuit boards that may be inserted into any one of the first slot and the second slot, and when a vertical direction against both of the first direction and a direction in which the electronic circuit boards are inserted into the first slot is defined as a second direction, including a first-side protrusion portion installed at a first-side of the second direction and a second-side protrusion portion installed at a second-side that is different from the first-side of the second direction, and an arrangement pattern of the first-side protrusion portion and the second-side protrusion is different from each other; a first abutment member installed against the first slot and rotatable around an axis of the first direction, and when an electronic circuit board of a kind having the first-side protrusion portion at the first position of the first direction is inserted into the first slot with the second slot is in an empty state, configured to abut the first-side protrusion portion of the first position and rotate from a first angle position to a second angle position; a second abutment member installed against the first slot and rotatable around an axis of the first direction, and when an electronic circuit board of a kind having the first-side protrusion portion at a second position different from the first position of the first direction is inserted into the first slot with the second slot is in an empty state, configured to abut the first-side protrusion portion of the second position and rotate from the first angle position to the second angle position; a first interlocking member installed against the second slot and rotating around an axis of the first direction either from a limit position to a retreat position or from the retreat position to the limit position, when in the retreat position and when an arbitrary electronic circuit board among the plurality of circuit boards is inserted into the second slot, configured not to interfere with the second-side protrusion portion of the arbitrary electronic circuit board, and when in the limit position and when an electronic circuit board of a kind having the second-side protrusion portion at a third position of the first direction is inserted into the second slot, configured to interfere with the second-side protrusion portion of the third position and block an insertion of the electronic circuit board of a kind having the second-side protrusion portion of the third position into the second slot; and a second interlocking member installed against the second slot and rotating around the axis of the first direction from the limit position to the retreat position or from the retreat position to the limit position by interlocking with a rotation of the second abutment member from the first angle direction to the second angle direction, when in the retreat position and when an arbitrary electronic circuit board among the plurality kinds of circuit boards is inserted into the second slot, configured not to interfere with the second-side protrusion portion of the arbitrary electronic circuit board, and when in the limit position and when an electronic circuit board of a kind having the second-side protrusion portion at a fourth position different from the third portion of the first direction is inserted into the second slot, configured to interfere with the second-side protrusion portion of the fourth position and block an insertion of the electronic circuit board of a kind having the second-side protrusion portion at the fourth position into the second slot.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a drawing illustrating an example of a combination limit table;

FIGS. 5A, 5B and 5C are drawings illustrating an operational example (part 1) of an insertion error protection function of the insertion error protection device 400;

FIGS. 6A and 6B are drawings illustrating a figure that the block 30A rotates a right-side abutment member 103 and a right-side interlocking member 203;

FIGS. 8A, 8B and 8C are drawings illustrating an operational example (part 3) of an insertion error protection function of the insertion error protection device 400;

FIG. 9 is a drawing illustrating another example of the combination limit table;

FIG. 18 is an example of the combination limit table implemented by the insertion error protection device 500;

FIG. 22 is a drawing illustrating an example of a combination limit table implemented by the insertion error protection device.

DESCRIPTION OF EMBODIMENTS

Hereinafter, each of the embodiments will be described in detail with reference to the accompanying drawings.

Figure 1:
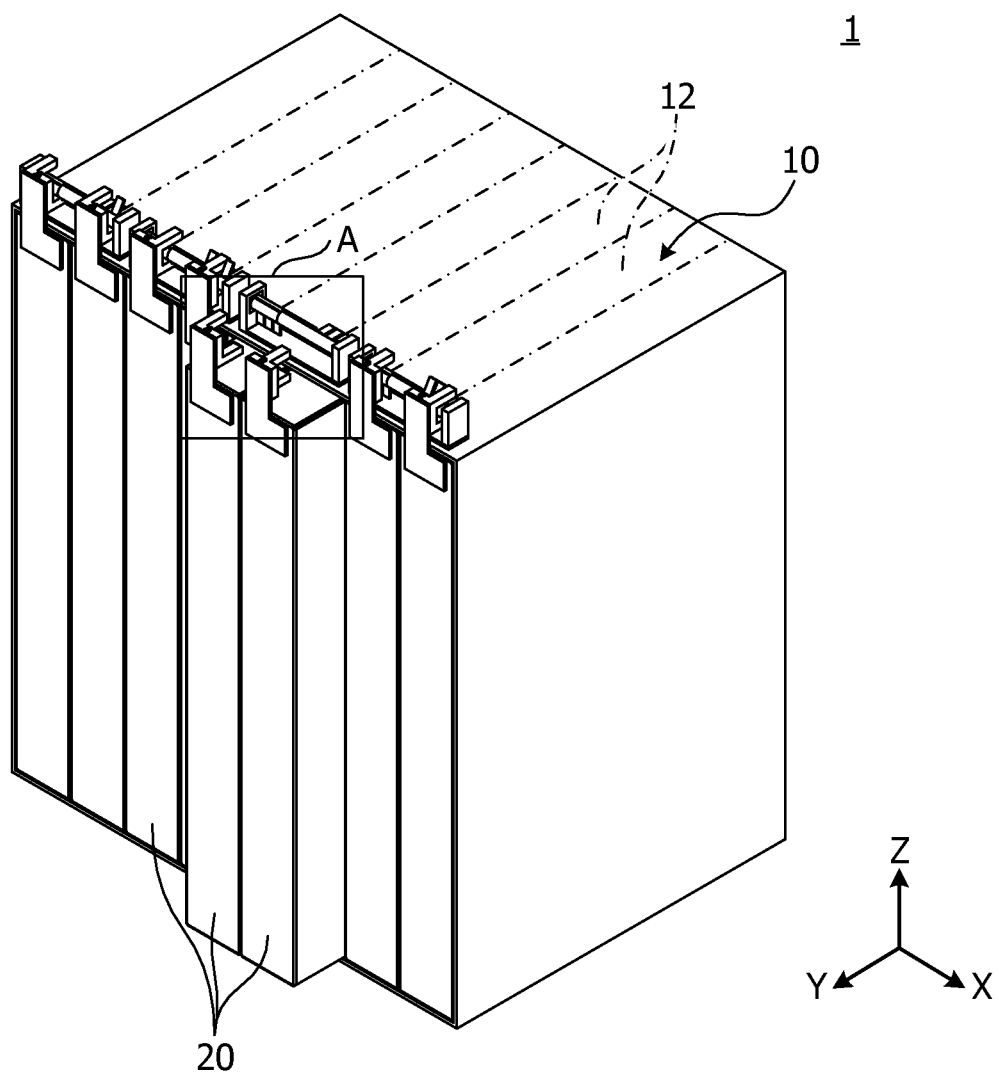
FIG. 1 is a perspective view illustrating an electronic device 1 according to an exemplary embodiment.
Figure 2:
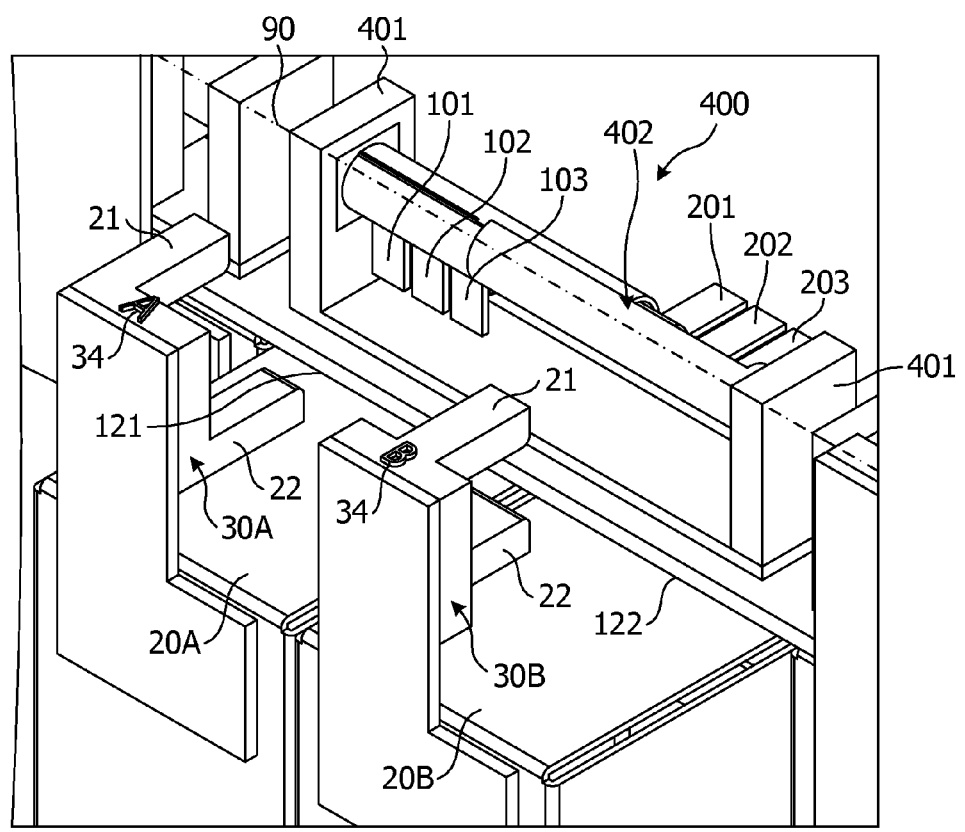
FIG. 2 is an enlarged drawing of the "A" portion of FIG. 1.

FIG. 1 is a perspective view illustrating an electronic device 1 according to an exemplary embodiment. FIG. 2 is an enlarged view of a portion of FIG. 1 indicated as "A." Hereinafter, each of X, Y, and Z axes in FIG. 2 is defined. The Z direction corresponds to an up and down direction, and the head of arrow is defined as an up direction. The Y direction corresponds to the insertion direction toward the slot 12, and the head of arrow is defined as a direction towards an entrance side and the opposite direction of the arrow is defined as a depth side. In addition, the X direction corresponds to the left and right direction, and the head of arrow is defined as the right side. In addition, the rotation direction is defined as a clockwise and a counter-clockwise based on a direction seen toward the arrow direction of the X direction. The direction of the electronic device 1 may be differed according to an actual mounting state. FIG. 2 illustrates a state where the two electronic circuit boards 20 are being inserted.

The electronic device 1 may form, for example, an optical transmission device. The electronic device 1 includes a shelf 10, a plurality of electronic circuit boards 20, a left-side abutment member 101, a center abutment member 102, a left interlocking member 201, and a central interlocking member 202. In an example shown in FIG. 1 and FIG. 2, the electronic device 1 also includes a right-side member 103 and a right interlocking member 203.

The shelf 10 is a container of the plurality of electronic circuit boards 20, and includes at least two slots 12 abutting the X direction (an example of the first direction). The slot 12 is a divide space in the shelf 10 where the electronic circuit board 20 is inserted. FIG. 1 illustrates a state where the electronic circuit board 20 is inserted into each of all of the eight slots 12. In FIG. 1, the slot 12 is schematically represented with the alternated long and short dash lines.

The electronic circuit board 20 may be a card-typed shape. The electronic circuit board 20 is equipped with an electronic circuit on the board (e.g., a printed board). A plurality of kinds of the electronic circuit board 20 may be mounted on the shelf 10. The kinds of the electronic circuit board 20 (the kinds of electronic circuit to be mounted) is not specifically determined, but, for example, an electronic circuit board for an interface or an electronic circuit board for switching the interface may be included. Hereinafter, when the kinds of the electronic circuit board 20 is discriminated, signs 20A to 20D are used with regard to the electronic circuit board 20. That is, it indicates that each of the electronic circuit boards 20A to 20D is different kind with each other. In addition, even though the kind of the electronic circuit board 20 is 3 kinds of the electronic circuit boards 20A to 20C in the present example, it may as well be two kinds, and four or more kinds.

Hereinafter, for the sake of description, when it is necessary to discriminate two abutting slots 12, a left-side of two abutting slots 12 is referred as a first slot 121, and a right-side is referred as a second slot 122. The first slot 121 and the second slot 122 may be abutting two arbitrary slots in which the combination of the kind of the inserted electronic circuit board 20 needs to be limited among the plurality of slots 12. A plurality pairs of the first slot 121 and the second slot 122 may be assumed with regard to a single shelf 10. FIG. 2 illustrates a state where the electronic circuit board 20 is being inserted into each of the first slot 121 and the second slot 122 of a first pair.

Figure 11:
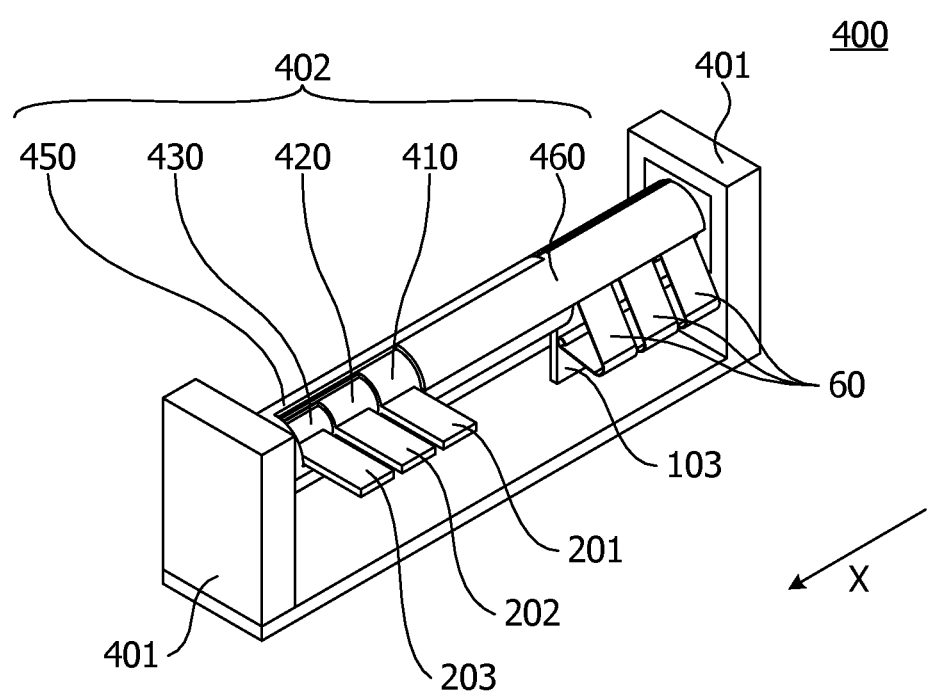
FIG. 11 is a perspective view illustrating an example of a single product state of the insertion error protection device 400.

In an example represented in FIG. 2, the left-side abutment member 101, the central abutment member 102, the right-side abutment member 103, the left interlocking member 201, the central interlocking member 202, the right-side interlocking member 203, and the key assembly 402 forms the insertion error protection device 400 according to an embodiment (a first embodiment) of the present disclosure (see, e.g., FIG. 11). In addition, the key assembly 402 is a part of a tube shape extended in the X direction between the left and right side-walls 401. The key assembly 402 will be described in detail later. The insertion error protection device 400, in cooperation with a block 30 that will be described in the following description, performs a function (e.g., an insertion error protection function) that limits the kind of the electronic circuit board 20 inserted into the first slot 121 and the second slot 122. The insertion error protection function will be described in the following description. The insertion error protection device 400 may be either attached to the shelf 10 or integrally formed with the shelf 10.

The left-side abutment member 101 is installed with respect to the first slot 121. The left-side abutment member 101 is rotatable about an axis of the X direction 90. In an example illustrated in FIG. 2, the left-side abutment member 101 is installed at the entrance side of the first slot 121 in the upper side than the top surface of the shelf 10. The left-side abutment member 101 will be described in detail in the following description.

The central abutment member 102 is installed with respect to the first slot 121. The central abutment member 102 is rotatable about the axis of the X direction 90. In an example illustrated in FIG. 2, the central abutment member 102 is installed next to the left-side abutment member 101 in the X direction. The central abutment member 102 will be described in detail in the following description.

The right-side abutment member 103 is installed with respect the first slot 121. The right-side abutment member 103 is rotatable about the axis of the X direction 90. In an example illustrated in FIG. 2, the right-side abutment member 103 is installed next to the left-side abutment member 101 and the central abutment member 102 in the X direction. The right-side abutment member 103 will be described in detail in the following description.

The left-side interlocking member 201 is installed with respect to the second slot 122. The left-side interlocking member 201 is rotatable about the axis of X direction 90 by interlocking the rotation of the left-side abutment member 101. In the example illustrated in FIG. 2, the left-side interlocking member 201 is installed at the entrance side of the second slot 122 in the upper side than the top surface of the shelf 10. The left-side interlocking member 201 will be described in detail in the following description.

The central interlocking member 202 is installed against the second slot 122. The central interlocking member 202 is rotatable about the axis of the X direction 90 by interlocking the rotation of the central abutment member 102. In an example illustrated in FIG. 2, the central interlocking member 202 is installed next to the left-side interlocking member 101 in the X direction. The center interlocking member 202 will be described in detail in the following description.

The right-side interlocking member 203 is installed with respect to the second slot 122. The right-side interlocking member 203 is rotatable about the axis of the X direction 90 by interlocking the rotation in the right-side abutment member 103. In an example illustrated in FIG. 2, the right-side interlocking member 203 is installed next to the left-side interlocking member 201 and the center interlocking member 202 in the X direction. The right-side interlocking member 203 will be described in detail in the following description.

In addition, in the examples illustrated in FIG. 1 and FIG. 2, the rotation direction from the initial position of each of the left-side abutment member 101, the central abutment member 102, the right-side abutment member 103, the left-side interlocking member 201, the center interlocking member 202, and the right-side interlocking member 203 is all clockwise. In addition, the axis 90 of the rotation center of the left-side abutment member 101, the central abutment member 102, the right-side abutment member 103, the left-side interlocking member 201, the center interlocking member 202, and the right-side interlocking member 203 is common.

The electronic circuit board 20 includes the block 30. The block 30 is attached to the top of the electronic circuit board 20 when a state where the block 30 is inserted into the slot 12 is taken as a reference. The block 30 is exposed outward of the shelf 10 in a state where the electronic circuit board 20 is inserted into the shelf 10.

The block 30 forms an insertion error protection system by being combined with the insertion error protection device 400, and implements an insertion error protection function. The insertion error protection function will be described in the following description.

When the block 30 is virtually divided into three sections (e.g., left-side, right-side, center) in the left and right direction, the position of each section corresponds to each of the left-side abutment member 101, the central abutment member 102, and the right-side abutment member 103 with regard to the first slot 121. That is, with regard to the first slot 121, the left-side section corresponds to the left-side abutment member 101, the central section corresponds to the central abutment member 102, and the right-side section corresponds to the right-side abutment member 103. In addition, with regard to the second slot 122, each position of the sections corresponds to the left-side interlocking member 201, the central interlocking member 202, and the right-side interlocking member 203. That is, with regard to the second slot 122, the left-side section corresponds to the left-side interlocking member 201, the central section corresponds to the center interlocking member 202, and the right-side section corresponds to the right-side interlocking member 203.

The block 30 includes a protrusion portion 21 of a bump shape (an example of the second projection portion) and a pressing portion 22 of a bump shape (an example of the first projection portion). The protrusion portion 21 is installed at the top of the block 30 and the pressing portion 22 is installed at the bottom of the block 30. Herein, the top side and bottom side of the block 30 are defined based on the position in the Y direction of the axis 90 (or the key assembly 402) when the electronic circuit board 20 having the block 30 is inserted into the slot 12. When the electronic circuit board 20 is inserted into the slot 12, the protrusion portion 21 of the block 30 passes the upper side of the key assembly 402 and reaches more to the depth side in the Y direction than the key assembly 402. In addition, when the electronic circuit board 20 is inserted into the slot 12, the pressing portion 22 of the block 30 passes the lower side of the key assembly 402 and reaches more to the depth side in the Y direction than the key assembly 402.

The block 30 has a different structure for each kind of the electronic circuit board 20. Hereinafter, when the block 30 needs to be discriminated, signs 30A to 30C are used with regard to the block 30. That is, each of the blocks 30A to 30C indicates that the kind of the blocks is different from each other. Each of the blocks 30A to 30C is attached to the electronic circuit boards 20A to 20C. In the blocks 30A to 30C, the position of the protrusion portion 21 in the X direction (e.g., left-side section, right-side section, and center section) and the position of the pressing portion 22 (e.g., left-side section, right-side section, and center section) in the X direction of the pressing portion 22 are different from each other. That is, in the blocks 30A to 30C, the arrangement pattern of the protrusion portion 21 and the pressing portion 22 is different from each other. In addition, the fact that the arrangement patterns of the protrusion portion 21 and the pressing 22 are different from each other indicates that the arrangement is not completely the same, and, for example, includes a case where while the protrusion portion 21 is in the same position, the pressing portion 22 is in a different position, or a case where while the protrusion portion 21 is in the same position, a part of the pressing portion 22 is in a different position.

In an example illustrated in FIG. 2, the electronic circuit board 20A includes the block 30A, and the electronic circuit board 20B includes the block 30B. In an example illustrated in FIG. 2, the position of the protrusion portion 21 and the position of the pressing portion 22 in the X direction of the block 30A are different from that of the block 30B. In addition, each of the block 30A and the block 30B may include a mark 34 that represents the kind of the electronic circuit boards 20A and 20B corresponding to the blocks 30A and 30B, respectively.

Next, the insertion error protection device 400 and the structure of the block 30 will be explained while explaining the insertion error protection function of the insertion error protection device 400.

Figure 4:
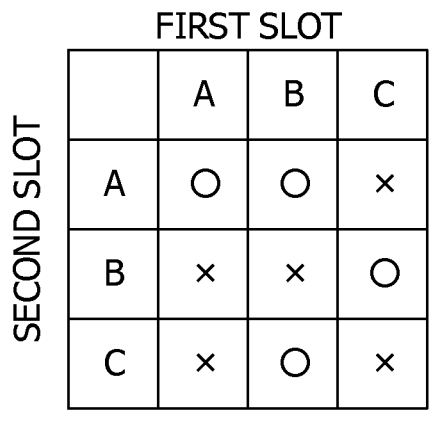

FIG. 3 to FIG. 8 are drawings explaining the insertion error protection function of the insertion error protection device 400. FIG. 3 is a perspective view illustrating an example of the blocks 30A to 30B, (A) illustrates an example of the block 30A, (B) illustrates an example of the block 30B, and (C) illustrates an example of the block 30C. FIG. 4 illustrates an example of a table (hereinafter, referred to a "combination limit table") that illustrates a combination of the kind of the electronic circuit board 20 that may be inserted into the first slot 121 and the second slot 122. FIG. 5 and FIG. 7 illustrate an operational example of the insertion error protection function of the insertion error protection device 400 for a case where the insertion of the electronic circuit board 20 to the first slot 121 is performed for the first time. FIG. 6 is a drawing illustrating an appearance that the block 30A rotates the right-abutment member 103 and the corresponding right-side interlocking member 203. FIG. 8 is a drawing illustrating an operational example of the insertion error protection function of the insertion error protection device 400 for a case where the insertion of the electronic circuit board 20 to the second slot 121 is performed for the first time.

The viewpoint of the combination limit table shown in FIG. 8 is as follows. The symbol O represents "INSERTABLE", and the symbol X represents "NOT INSERTABLE." The symbol "A" represents the electronic circuit board 20A, the symbol "B" represents the electronic circuit board 20B, and the symbol "C" represents the electronic circuit board 20C. For example, in an example of FIG. 4, when the electronic circuit board 20A is inserted into the first slot 121, "A" is "0", "B" is "0," and "C" is "X," in the second slot 122. This indicates that when the electronic circuit board 20A is inserted into the first slot 121, the electronic circuit board 20A or 20B may be inserted into the second slot 122, but the electronic circuit board 20C may not be inserted into the electronic circuit board 20C. In addition, the combination limit table may be set based on the cases, for example, when two kinds of the electronic circuit board 20 need to be mounted in an abutted pair, or when it is intended that the electronic circuit board 20 of high electromagnetic wave or high temperature is not mounted in a neighborhood.

Figure 3A:
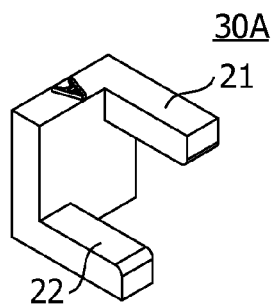
FIGS. 3A, 3B and 3C are drawings illustrating an example of blocks 30A to 30C.
Figure 3B:
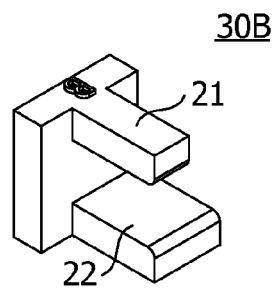
Figure 3C:
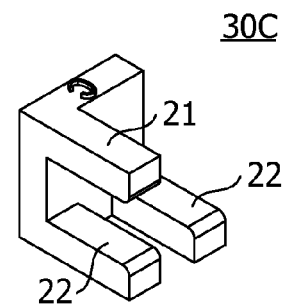

With respect to each of the blocks 30A to 30C, the determination whether which section among the sections of left-side, right-side, and center is the section where the protrusion portion 21 and the processing portion 22 are to be formed is made based on the combination limit table. In addition, the protrusion portion 21 and/or the pressing portion 22 may be formed not only in one section among left-side, right-side, center, but may be formed in two sections as well as illustrated in FIG. 3B and FIG. 3C.

The structure of the block 30A to 30C for implementing the combination limit table (an arrangement pattern of the protrusion portion 21 and the pressing portion 22) illustrated in FIG. 4 is as follows. As shown in FIG. 3A, the block 30A has the protrusion portion 21 only at the left-side section. In addition, as illustrated in FIG. 3A, the block 30A has the pressing portion 22 only at the right-side section. As illustrated in FIG. 3B, the block 30B has the protrusion portion 21 only at the center section. In addition, as illustrated in FIG. 3B, the block 30B has the pressing portion 22 at two sections of the left-section and the center section. As illustrated in FIG. 3C, the block 30C has the protrusion portion 21 only at the right-side section. In addition, the block 30C has the pressing portion 22 at two sections of the left-section and the center section.

In an initial state illustrated in FIG. 5A, the first slot 121 and the second slot 122 are emptied, and none of the electronic circuit boards 20 is inserted. In this initial state, as illustrated in FIG. 5A, the left-side abutment member 101, the center abutment member 102, and the right-side abutment member 103 are in the initial position downwardly extended (an example of the first angle position). In addition, in this initial state, as illustrated in FIG. 5A, the left-side interlocking member 201, the center interlocking member 202, and the right-side interlocking member 203 are in the initial position extending horizontally toward the front end side of in the depth side.

Herein, as illustrated in FIG. 5B, in the initial state illustrated in FIG. 5A, it is assumed that the electronic circuit board 20A is inserted into the first slot 121 for the first time. As described above, the block 30A, as illustrated in FIG. 3A, has the pressing portion 22 only at the section of the right side. In this case, when the electronic circuit board 20A is inserted into the first slot 121, as illustrated in FIG. 6A, the right-side abutment member 103 is pressed to the depth side of the Y direction by abutting the pressing portion 22 of the block 30A. As a result, the right-side abutment member 103 is rotated toward a certain angle position (an example of the second angle position) from the initial position as illustrated in FIG. 6B. Along with this, the right-side interlocking member 203 is rotated to a certain angle position (an example of the limit position) from an initial position around an axis of the X direction, as illustrated in FIG. 6B.

Figure 7A:
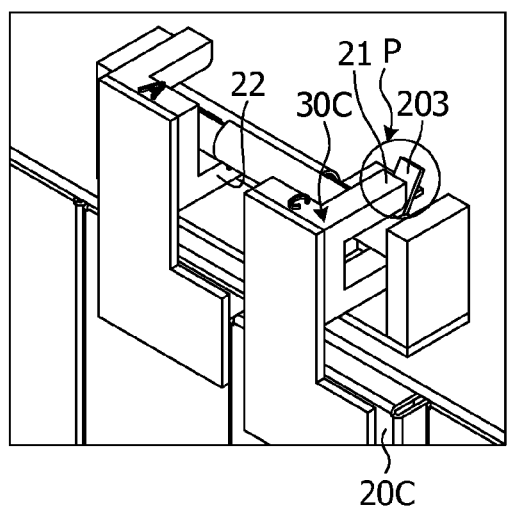
FIGS. 7A and 7B are drawings illustrating an operational example (part 2) of an insertion error protection function of the insertion error protection device 400.

When an insertion of the electronic circuit board 20A into the first slot 121 is completed, as illustrated in FIG. 4, the electronic circuit board 20A or 20B may be inserted into the second slot 122. However, the electronic circuit board 20C may not be inserted into the second slot 122. For example, FIG. 7A illustrates a state where the electronic circuit board 20C is being inserted into the second slot 122. As described above, the block 30C of the electronic circuit board 20C has the protrusion portion 21 at the right-side section as illustrated in FIG. 3C. Accordingly, when the electronic circuit board 20C is inserted into the second slot 122, the right-side interlocking member 203 interferes with the protrusion portion 21 of the electronic circuit board 20C and thus, blocks the insertion of the electronic circuit board 20C into the second slot 122 which is represented as "P" in FIG. 7A.

Figure 7B:
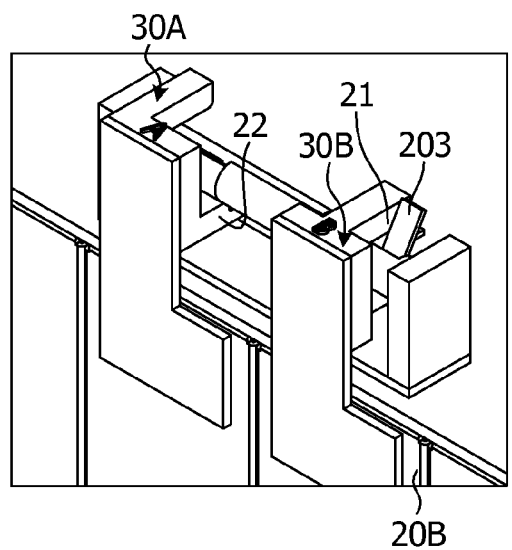

In addition, the right-side interlocking member 203 interferes with the protrusion 21 of the electronic circuit board 20C to be pressed to depth side of the Y direction, but the rotation of the right-side interlocking member 203 to the depth side is not possible due to the existence of the pressing portion 22 of the electronic circuit board 20A. Accordingly, it becomes impossible to insert the electronic circuit board 20C into the second slot 122. Meanwhile, FIG. 7B illustrates a state where the electronic circuit board 20B is being inserted into the second slot 122. As described above, the block 30B of the electronic circuit board 20C has the protrusion portion 21 only in the section of the center as illustrated in FIG. 3B. Accordingly, when the electronic circuit board 20B is inserted into the second slot 122, the right-side interlocking member 203 is not abutted to the protrusion portion 21 of the electronic circuit board 20B. As such, the electronic circuit board 20B may be inserted into the second slot 122.

Even though a case is assumed where the electronic circuit board 20A is inserted into the first slot 121 for the first time, other cases where the electronic circuit boards 20B or 20C are inserted into the first slot 121 for the first time would be the same situation. For example, when the electronic circuit board 20B is inserted into the first slot 121 for the first time, the left-side abutment member 101 and the center abutment member 102 are rotated to a certain angle position (an example of the second angle position) from the initial position. Also, the left-side interlocking member 201 and the center interlocking member 202 are rotated to a certain angle position (an example of limit position) from the initial position about an axis of the X direction.

Accordingly, the electronic circuit board 20 having the block 30 having the protrusion portion 21 in any one of the left-side section and the center section, that is, the electronic circuit board 20A and the electronic circuit board 20B in the present example, may not be inserted into the second slot 122. Meanwhile, the electronic circuit board 20C having the block 30C having the protrusion portion 21 only at the right-side section may be inserted into the second slot 122.

Next, as illustrated in FIG. 8A, a case is assumed where the electronic circuit board 20A is inserted into the second slot 122 for the first time in the initial state illustrated in FIG. 5A. That is, it is assumed that the electronic circuit board 20A is inserted into the second slot 121 in a state where the first slot 121 is in an empty state.

As described above, in the state illustrated in FIG. 5A, the left-side interlocking member 201, the center interlocking member 202, and the right-side interlocking member 203 are in the initial position (an example of a retreat position) extended toward the depth side in horizontal direction. Accordingly, when the electronic circuit board 20A is inserted into the second slot 122, none of the left-side interlocking member 201, the center interlocking member 202, and the right-side interlocking member 203 is abutted to the protrusion portion 21 of the electronic circuit board 20A. Accordingly, in a state where the first slot 121 is in an empty state, it is possible to insert the electronic circuit board 20A into the second slot 122 as illustrated in FIG. 8A.

As such, when an insertion of the electronic circuit board 20A into the second slot 122 is completed, as shown in FIG. 4, it is possible to insert the electronic circuit board 20A into the first slot 121. However, the electronic circuit boards 20B or 20C may not be inserted into the second slot 122. For example, FIG. 8B illustrates a state where the insertion of the electronic circuit board 20A into the second slot 122 is completed, and the electronic circuit board 20B is being inserted into the first slot 121. As described above, the block 30B of the electronic circuit board 20B includes the pressing portion 22 in two sections of the left-side and the center as illustrated in FIG. 3B. Accordingly, when the electronic circuit board 20B is inserted into the first slot 121, the left-side abutment member 101 and the center abutment member 102 are pressed in the depth side of the Y direction by abutting the pressing portion 22. Accordingly, the left-side abutment member 101 and the center abutment member 102 receive a power of a rotating direction toward a certain angle position (an example of the second angle position) from the initial position.

However, as represented by the P portion of FIG. 8B, the left-side interlocking member 201 interferes with the protrusion 21 of the electronic circuit board 20A and the rotation of the clockwise direction is hindered. Accordingly, the clockwise rotation of the left-side abutment member 101 is blocked. As such, the electronic circuit board 20B may not be inserted into the first slot 121 in a state where an insertion of the electronic circuit board 20A into the second slot 122 is completed. Similarly for the electronic circuit board 20C, when the electronic circuit board 20C is inserted into the first slot 121, the left-side abutment member 101 is pressed in the depth side of the Y direction by abutting the pressing portion 22 of the electronic circuit board 20C but the rotation in the left-side abutment member 101 is blocked. As such, in a state where an insertion of the electronic circuit board 20A into the second slot 122 is completed, the electronic circuit board 20C may not be inserted into the first slot 121.

FIG. 8C illustrates a state where an insertion of the electronic circuit board 20A into the second slot 122 is completed, and the electronic circuit board 20A is being inserted into the first slot 121. As described above, the block 30A of the electronic circuit boards 20A does not have the pressing portion 22 at the section the left-side as illustrated in FIG. 3A. Accordingly, when the electronic circuit board 20A is inserted into the first slot 121, the left-side abutment member 101 is not abutted to the pressing portion 22 of the electronic circuit boards 20A and the left-side abutment member 101 is not pressed in the depth side of the Y direction. As such, in a state an insertion of the electronic circuit board 20A into the second slot 122 is completed, the electronic circuit boards 20A may be inserted into the first slot 121.

As such, according to the examples illustrated in FIG. 3 to FIG. 8, as defined in the combination limit table illustrated in FIG. 4, the combination of kinds of the electronic circuit board 20 that may be inserted into the first slot 121 and 122 may be limited. That is, according to the pattern following the arrangement pattern of the pressing portion 22 of the block 30 depending on the electronic circuit board 20 to be inserted into the first slot 121, any one or two of the three abutment members 101 to 103 is rotated up to a certain angle position.

Therefore, according to the arrangement pattern of the pressing portion 22 of the block 30 regarding the electronic circuit board 20 that is inserted into the first slot 121, the pattern of the interlocking member positioned in the limited position among the three interlocking members 201 to 203 is changed. If the pattern of the interlocking member positioned in the limited position among the three interlocking members 201 to 203 is changed, the arrangement pattern of the protrusion portion 21 of the block 30 that abuts the interlocking members 201 to 203 is changed when the electronic circuit board 20 is inserted into the second slot 122. That is, the kind of the electronic circuit board that may not be inserted into the second slot is changed. As such, the combination of the kinds of the electronic circuit board that may be inserted into the abutted first slot 121 and the second slot 122 may be limited.

In addition, according to the examples shown in FIG. 3 to FIG. 8, the combination of kinds of the electronic circuit board 20 may be limited as defined in the combination limit table illustrated in FIG. 4, even in a case where the electronic circuit board 20 is inserted for the first time into any one of the first slot 121 and the second slot 122 both of them are emptied.

In addition, according to the examples illustrated in FIG. 3 to FIG. 8, in a state where the electronic circuit board 20 is inserted into both of the first slot 121 and the second slot 122, the electronic circuit board 20 may be extracted first from any one of the first slot 121 and the second slot 122.

That is, it is possible to eliminate the limitation of the removal order from the first slot 121 and the second slot 122 that abut with each other.

Figure 9:
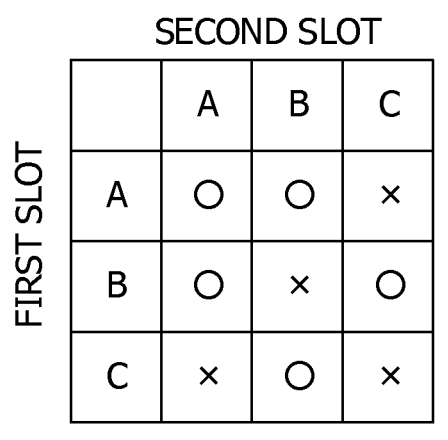

In addition, as described above, in each of the block 30A to 30C, the selection of a section where the protrusion portion 21 and the processing portion 22 are to be formed is determined based on the combination limit table. Accordingly, if the combination limit table is different from one another, the structure of the block 30A to 30C becomes also different from each other. For example, FIG. 9 illustrates an exemplary combination limit table that is different from the combination limit table of FIG. 4. FIG. 10 is a drawing illustrating the structure of the blocks 30A to 30C for implementing the combination limit table of FIG. 9.

Figure 10A:
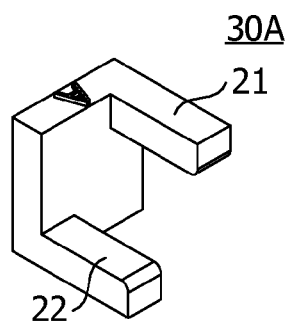
FIGS. 10A, 10B and 10C are drawings illustrating the structure of block 30A to block 30C for implementing the combination limit table in FIG. 9.
Figure 10B:
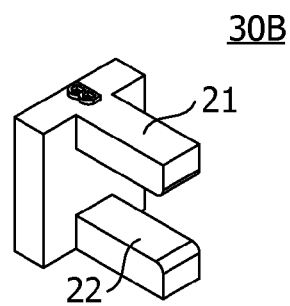
Figure 10C:
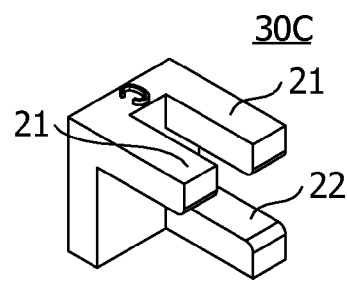

In an example illustrated in FIG. 10, the block 30A has the protrusion portion 21 only at the left-side section as illustrated in FIG. 10A. In addition, the block 30A has the pressing portion 22 only at the right-side section as illustrated in FIG. 10A. The block 30B has the protrusion portion 21 only at the center section as illustrated in FIG. 10B. In addition, the block 30B has the pressing portion 22 only at the center section as illustrated in FIG. 10B. The block 30C has the protrusion portion 21 at the two sections of the right-side and left-side as illustrated in FIG. 10C. In addition, the block 30C has the pressing portion 22 only at the left-side section as illustrated in FIG. 10C.

As such, by changing the structure of the blocks 30A to 30B attached to the electronic circuit boards 20A to 20C, the combination of the kinds of the electronic circuit board 20 that may be inserted into the abutted first and second slots 121 and 122 may be readily changed. That is, by appropriately setting the arrangement pattern of the protrusion portion 21 and the pressing portion 22 of the blocks 30A to 30C, the combination of the kinds of the electronic circuit board 20 that may be inserted into the abutted first and second slots 121 and 122 may be limited to a desired combination.

In addition, if the block 30 of various arrangement patterns is prepared in advance, it is possible to react to the case where the combination of the kinds of the electronic circuit board 20 that may be inserted into the abutted first and second slots 121 and 122 becomes diversified. This case is suitable for the case where the block 30 may be attached to the electronic circuit board 20 (e.g., the case where the block 30 is not integrally formed with the electronic circuit board 20). In this case, the reason is because an appropriate kind of block 30 may be attached to the electronic circuit board 20 according to the kind of the electronic circuit board 20.

Next, with reference to FIG. 11 to FIG. 15, an example of the structure of the insertion error protection device 400 will be described.

Figure 12:
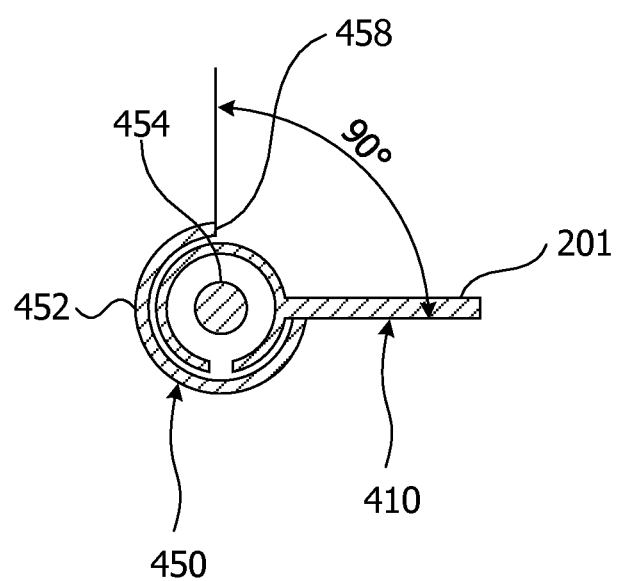
FIG. 12 is a sectional view illustrating the relationship between a first cover 450 and a first key 410.
Figure 13:
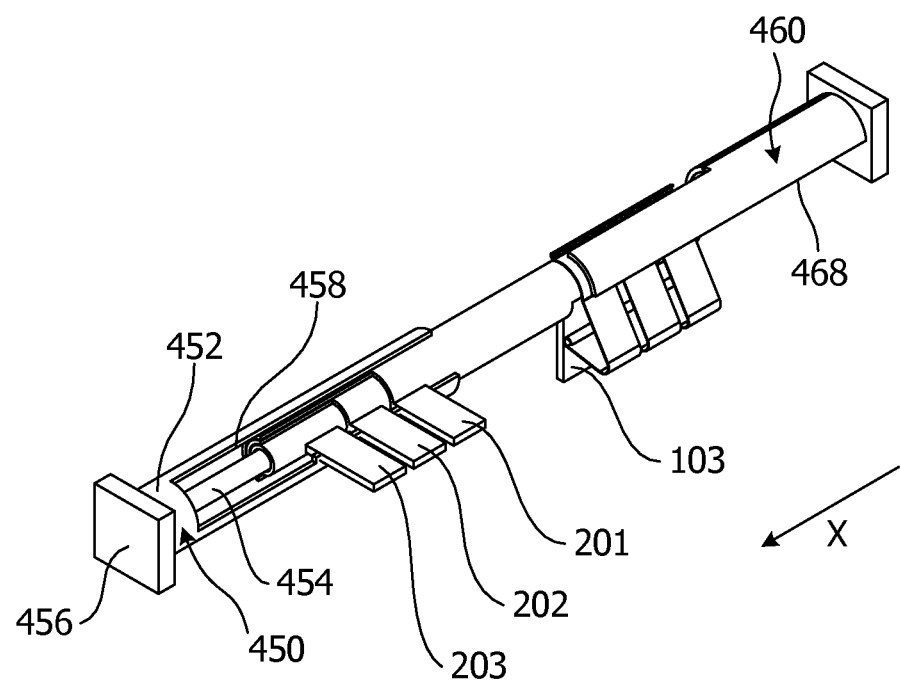
FIG. 13 is a perspective view illustrating a state where a key assembly 402 is being disassembled.
Figure 14A:
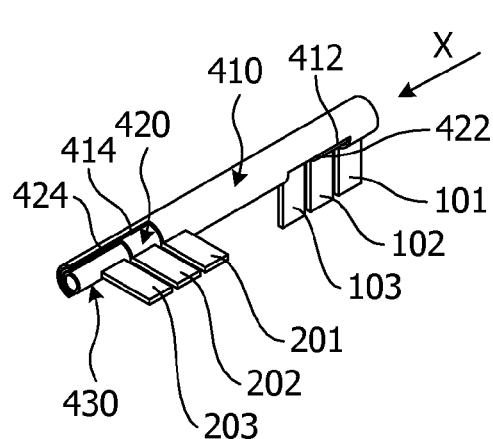
FIGS. 14A and 14B are perspective views illustrating a state where the first cover 450 and the second cover 460 are removed from the key assembly 402.
Figure 14B:
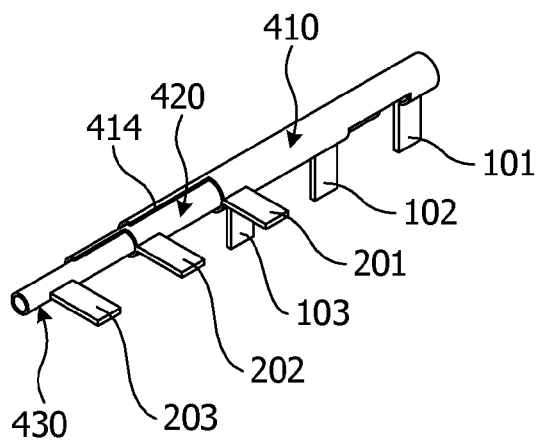
Figure 15:
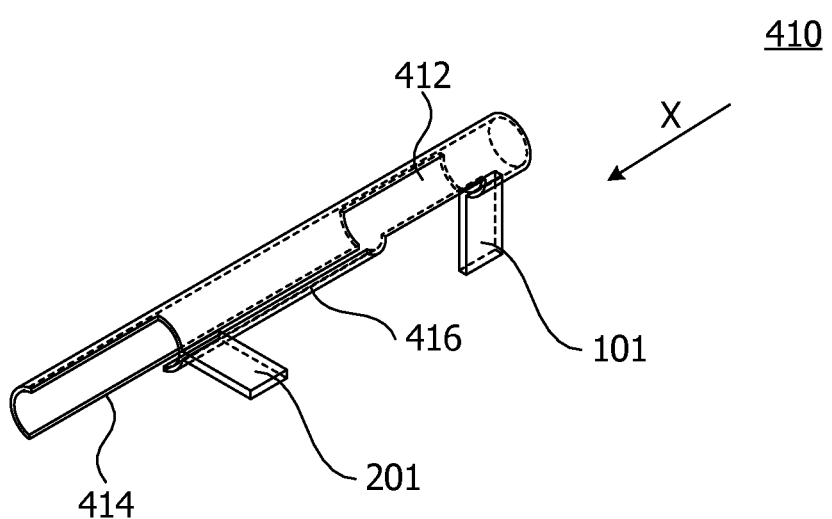
FIG. 15 is a perspective view illustrating a single product state of the first key 410.

FIG. 11 is a perspective view illustrating an example of the insertion error protection device 400 in a single product state. FIG. 12 is a cross sectional view illustrating the relationship between a first cover 450 and a first key 410. FIG. 13 is a perspective view illustrating a state where a key assembly 402 is being disassembled. FIG. 14 is a perspective view illustrating a state where the first cover 450 and the second cover 460 are removed from the key assembly 402. The symbol (A) represents a state where the first key 410, the second key 420, and the third key 430 are assembled, and the symbol (B) operation is being performed. FIG. 15 is a perspective view illustrating the first key 410 in a single product state.

The insertion error protection device 400 includes two side-walls 401 and the key assembly 402.

The two side-walls 401 are disposed by being separated in the X direction with each other. The distance between the two side-walls 401 in the X direction may correspond to an extended range of the first and second slots 121 and 122 in the X direction.

The key assembly 402 includes the first key 410, the second key 420, the third key 430, the first cover 450, and the second cover 460.

The first key 410 has a tube shape as illustrated in FIG. 15. The first key 410 includes an opening 412, an opening 414, and a slit 416. The slit 416 is extended in the X direction, and formed between the opening 412 and the opening 414. The slit 416 is formed to pass the center abutment member 102 of the second key 420 and the right-side abutment member 103 of the third key 430 at an assembly or a disassembly process. The first key 410 has the left-side abutment member 101 by abutting to the opening 412, and has the left-side interlocking member 201 by abutting the opening 414. The left-side abutment member 101 and the left-side interlocking member 201 may as well be integrally formed on a circumference of the first key 410, or may be attached to the first key 410 as well. The opening 412 exposes the center abutment member 102 and the right-side abutment member 103, and the opening 414 exposes the left-side interlocking member 201 and the center interlocking member 202.

The second key 420 has a tube shape. The second key 420 includes the center abutment member 102 and the center interlocking member 202. The center abutment member 102 and the center interlocking member 202 may be integrally formed on a circumference of the second key 420, and may be attached to the key 420 as well. The second key 420 has an outer diameter which is a little smaller than an internal diameter of the first key 410. The second key 420 is inserted into the inside of a hollow of the first key 410. The second key 420 has a slit (not illustrated) in order to pass the right-side abutment member 103 of the third key 430 at an assembly or a disassembly process. In addition, the second key 420 has the openings 422 and 424 that expose the right-side abutment member 103 and the right-side interlocking member 203 (see, e.g., FIG. 14).

The third key 430 has a tube shape. The third key 430 includes the right-side abutment member 103 and the right-side interlocking member 203. The right-side abutment member 103 and the right-side interlocking member 203 may be integrally formed on a circumference of the third key 430, or may be attached to the third key 430. The third key 430 has an outer diameter which is a little smaller than an internal diameter of the second key 420. The third key 430 is inserted into the inside of a hollow of the second key 420.

The first cover 450 includes an outer shell portion 452, an inner axis portion 454, and an end portion 456. The outer shell portion 452 and the inner axis portion 454 are extended from the end portion 456 in the X direction. The first key 410, the second key 420, and the third key 410 are inserted between the outer shell portion 452 and the inner axis portion 454 in the diameter direction. That is, the third key 430, the second key 420, and the first key 410 are installed to be overlapped with each other around the inner axis portion 454, and the outer shell portion 452 covers the circumference of the first key 410. The inner axis portion 454 forms a rotation axis 90 (see, e.g., FIG. 2). The end portion 456 is assembled on the side walls 401. The outer shell portion 452 has an opening 458 as illustrated in FIG. 12.

The first cover 450 exposes the left-side interlocking member 201, the center interlocking member 202 and the right-side interlocking member 203 from the opening 458, while maintaining the right end portion of the first key 410, the second key 420 and the third key 430. The opening 458 is formed in a predetermined angle range (e.g., 90 degrees in the present example) about an axis of the inner axis portion 454. The opening 458 has a function that regulates the rotation range of each of the left-side interlocking member 201, the center interlocking member 202, and the right-side interlocking member 203. That is, as illustrated in FIG. 12, the left-side interlocking member 201 may be rotated up to the range of the opening 458. In addition, the opening 414 of the first key 410 and the opening 424 of the second key 420 are formed in the same range about the axis of the inner axis portion 454.

The second cover 460 is practically formed in a bilateral symmetry with the first cover 450. The second cover 460 exposes the left-side abutment member 101, the center abutment member 102, and the right-side abutment member 103 from the opening 468 while maintaining the left end portion of the first key 140, the second key 420, and the third key 430. The second cover 460 has the opening 468 at a different circumference position (e.g., a range about the axis of the inner axis portion 454) from the opening 458 of the first cover 450. That is, the opening 468 is formed at the position having a difference of 90 degrees in a counter clockwise direction against the opening 458. The three plate springs 60 are installed in the opening 468. Each of the three plate springs 60 pressurizes the left-side abutment member 101, the center abutment member 102, and the right-side abutment member 103, respectively, toward an initial position (e.g., in a counter clockwise direction).

According to the structure of the insertion error protection device 400 illustrated in FIG. 11 to FIG. 15, each of the left-side abutment member 101, the center abutment member 102, and the right-side abutment member 103 is rotatable from the initial position up to a certain angle range (e.g., 90 degrees in the present example) due to the regulation by the openings 468, 412, and 422. Each of the left-side interlocking member 101, the center interlocking member 102, and the right-side interlocking member 103 is rotatable from the initial position up to a certain angle range (e.g., 90 degrees in the present example) due to the regulation by the openings 458, 414, and 424. Each of the left-side abutment member 101, the center abutment member 102 and the right-side abutment member 103 is pressurized by the plate spring 60, and returns to the initial position when the electronic circuit board 20 that is rotated up to a certain angle position (an example of the second angle position) is extracted from the inside of the first slot 121.

Each of the left-side interlocking member 101, the center interlocking member 102 and the right-side interlocking member 103 is integrally formed with each of the left-side abutment member 101, the center abutment member 102 and the right-side abutment member 103, by the first key 410, the second key 420, and the third key 430. Accordingly, a simple structure that interlocks the rotation of each of the left-side interlocking member 101, the center interlocking member 102, and the right-side interlocking member 103 with each of the rotations of the left-side abutment member 101, the center abutment member 102 and the right-side abutment member 103 may be formed. In addition, as illustrated in FIG. 13 and FIG. 14, the key assembly 402 is easy to assemble or disassemble, since the first key 410, the second key 420, and the third key 430 are assembled to become a tube structure at the inside of a diameter direction of the first cover 450 and the second cover 460 detachable in the left and right directions.

Figure 16:
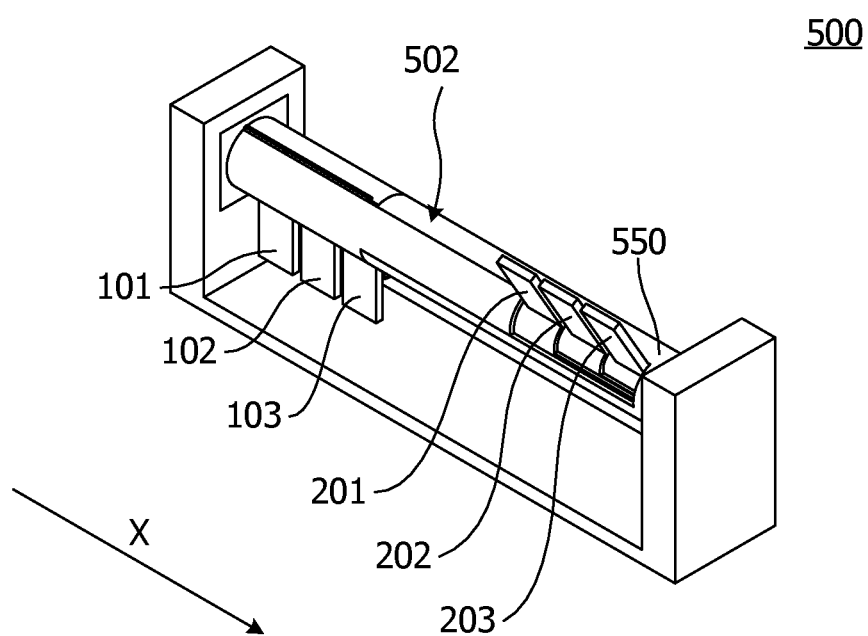
FIG. 16 a perspective view illustrating the insertion error protection device 500 according to another exemplary embodiment.
Figure 17:
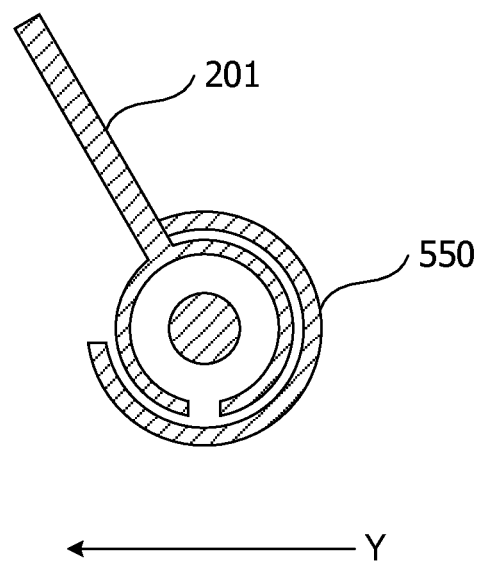
FIG. 17 a sectional view illustrating the relationship between the left interlocking member 201 and the first cover 550.

FIG. 16 is a perspective view illustrating an insertion error protection device 500 according to another embodiment (second embodiment). FIG. 17 a cross sectional view illustrating the relationship between the left-side interlocking member 201 and the first cover 550. Comparing the insertion error protection device 400 according to the first embodiment described above, the initial position of the left-side interlocking member 201, the center interlocking member 202, the right-side interlocking member 203 of the insertion error protection device 500 of the second embodiment is different. Other structures of the insertion error protection device 500 of the second embodiment may substantially be similar to the insertion error protection device 400 of the first embodiment described above.

As illustrated in FIG. 16, the left-side interlocking member 201, the center interlocking member 202, and the right-side interlocking member 203 are disposed in the initial position (an example of a limit position) extended in an upper side than the key assembly 502. In an example illustrated in FIG. 16, the left-side interlocking member 201, the center interlocking member 202, and the right-side interlocking member 203 are disposed in the initial position extended in an aspect where the front-end side is directed toward the upper side of the incline and toward the front side.

As illustrated in FIG. 17, the rotation of the counter clockwise direction of the left-side interlocking member 201 from the initial position is regulated by the first cover 550. In the left-side interlocking member 201, only the rotation of the clockwise direction from the initial position to the retreat position is permitted. In the retreat position, the left-side interlocking member 201 is horizontally extended at the front side of the first cover 550 in the Y direction. In addition, the rotatable range of the left-side interlocking member 201 is random, but in an example illustrated in FIG. 17, the rotatable range is smaller than 90 degrees. The center interlocking member 202 and the right-side interlocking member 203 have similar rotatable range to the left-side interlocking member 201.

Figure 18:
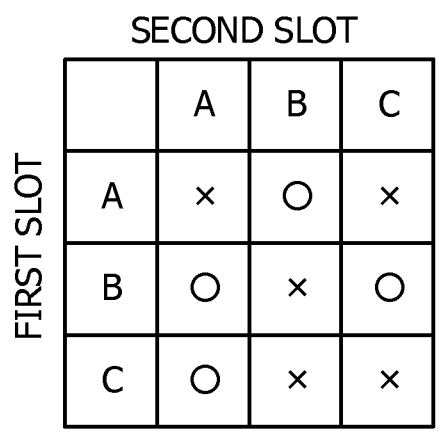

FIG. 18 is an example of the combination limit table implemented by the insertion error protection device 500. FIG. 19 is a drawing illustrating the structure of block 300A to 300C for implementing the combination limit table of FIG. 18. FIG. 20 is a drawing illustrating an operational example of the insertion error protection function of the insertion error protection device 500. In addition, in FIG. 20, for the sake of simplicity, for example, the electronic circuit board 20 or the first slot 121 to which, for example, the original block 300A is attached, is not illustrated.

The blocks 300A to 300C are different from the blocks 30A to 30C used for the insertion error protection device 400 according to the first embodiment described above in that the blocks 300A to 300C have a concave portion 26. The concave portion 26 is extended in the X direction and formed at all of the three sections (e.g., left-side, right-side, and center) in the left and right directions. The concave portion 26 is formed between the protrusion 21 and the pressing portion 22 in the Z direction (an example of the second direction).

Figure 19A:
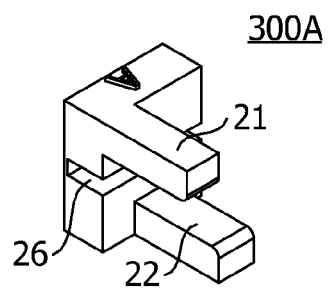
FIGS. 19A, 19B and 19C are drawings illustrating the structure of block 300A to block 300C for implementing the combination limit table in FIG. 18.
Figure 19B:
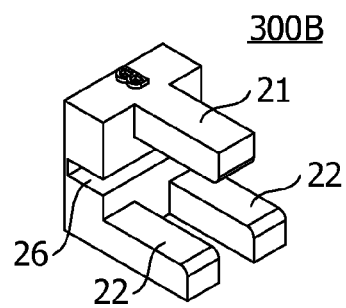
Figure 19C:
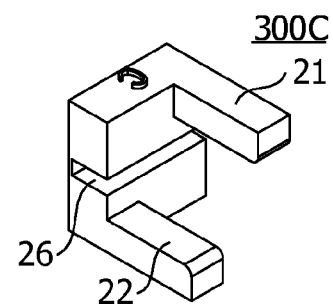

The structure of the blocks 300A to 300C for implementing the combination limit table as illustrated in FIG. 18 is as follows. As illustrated in FIG. 19A, the block 300A has the protrusion portion 21 only at the right-side section. In addition, the block 300A, as illustrated in FIG. 19A, has the pressing portion 22 only at the center section. As illustrated in FIG. 19B, the block 300B has the protrusion portion 21 only at the center section. In addition, the block 300B, as illustrated in FIG. 19B, has the pressing portion 22 at the two sections of the left-side and the right-side. As illustrated in FIG. 19C, the block 300C has the protrusion portion 21 only at the left-side section. Also, the block 300C, as illustrated in FIG. 19C, has the pressing portion 22 only at the right-side section.

Figure 20A:
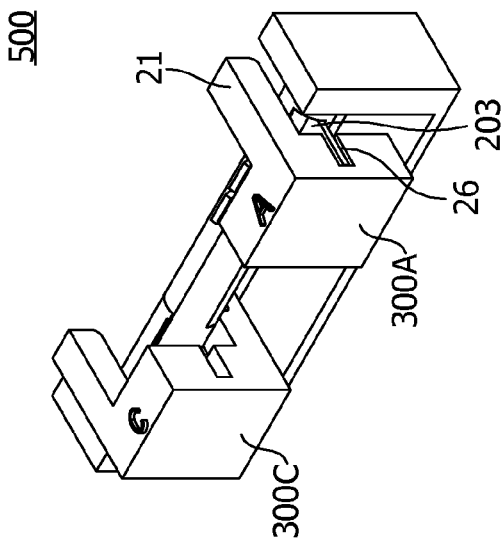
FIGS. 20A, 20B and 20C are drawings illustrating an operational example of the insertion error protection function of the insertion error protection device 500.

In an example shown in FIG. 20A, the first slot 121 and the second slot 122 (not illustrated) are assumed to be an empty state (initial state). In the initial state, as illustrated in FIG. 20A, for example, when the electronic circuit board 20A having the block 300A is inserted into the second slot 122, the right-side interlocking member 203 is abutted to the protrusion portion 21 of the block 300A. Even though the right-side interlocking member 203 is pressed in the depth side of the Y direction, as described above, a rotation in the counter clockwise direction from the initial position (an example of the limit position) may not be permitted. As such, when the electronic circuit board 20A is inserted into the second slot 122, the right-side interlocking member 203 disposed in the initial position interferes with the protrusion portion 21 of the block 300A to block the electronic circuit board 20A from being inserted into the second slot 122.

Similarly, the electronic circuit board 20B having the block 300B and the electronic circuit board 20C having the block 300C may not be inserted into the second slot 122. As such, in a state where the first slot 121 is in an empty state, all kinds of the electronic circuit board 20 having the protrusion portion 21 may not be inserted into the second slot 122 due to the left-interlocking member 201, the center interlocking member 202 and the right-side interlocking member 122 disposed in the initial position (an example of limit position). Accordingly, in the insertion error protection device 500, the order of insertion may also be regulated.

Figure 20B:
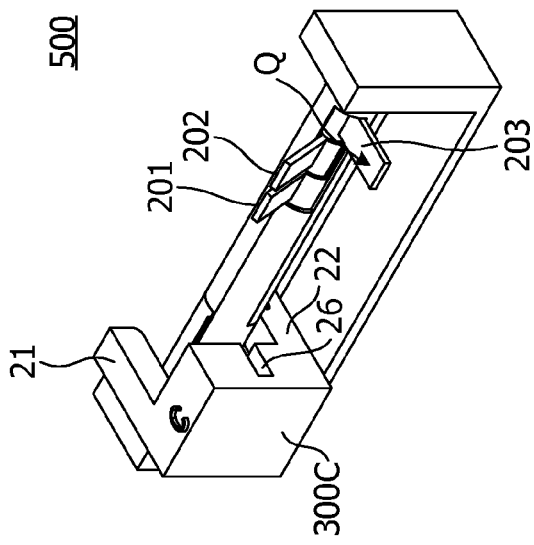

In an example illustrated in FIG. 20B, it is assumed that the electronic circuit board 20C having the block 300C is inserted into the first slot 121 for the first time. In this case, when the electronic circuit board 20C is inserted into the first slot 121, the right-side abutment member 103 is pressed in the depth side of the Y direction by abutting the pressing portion 22 of the block 300C. Accordingly, the right-side abutment member 103 is rotated up to a certain angle position (an example of the second angle) from the initial position (an example of the first angle position). Also, as represented by the arrow Q in FIG. 20B, the right-side interlocking member 203 is rotated up to a certain angle position (an example of the back position) from the initial position around the axis of the X direction (an example of the limit position).

Figure 20C:
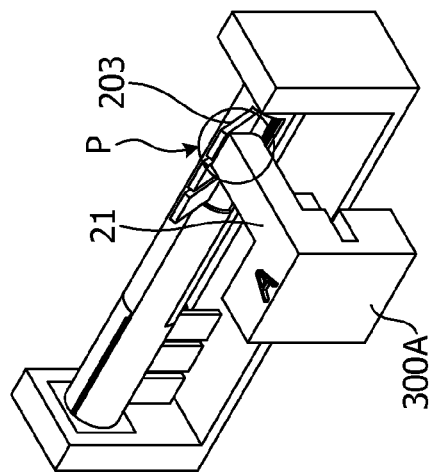

In an example illustrated in FIG. 20C, it is assumed that the electronic circuit board 20A having the block 300A is inserted into the second slot 122 in a state where the electronic circuit board 20C having the block 300C is inserted into the first slot 121. In a state where the electronic circuit board 20C having the block 300C is inserted into the first slot 121, the left-side interlocking member 201 and the center interlocking member 202 are disposed in the initial position (an example of the limit position) as illustrated in FIG. 20B. Accordingly, the electronic circuit board 20B that has the block 300B having the protrusion portion 21 at the center section, or the electronic circuit board 20C that has the block 300C having the protrusion 21 at the left-side section sill may not be inserted into the second slot 122 (see, e.g., FIG. 18).

For example, when the electronic circuit board 20B having the block 300B is inserted into the second slot 122, the center interlocking member 202 interferes with the protrusion portion 21 of the block 300B and blocks the electronic circuit board 20B from being inserted into the second slot 122. In contrast, the electronic circuit board 20A having the block 300A does not have the protrusion portion 21 at the left-side section and the center section. Accordingly, when the electronic circuit board 20A having the block 300A is inserted into the second slot 122, the left-side interlocking member 201 and the center interlocking member 202 disposed in the initial position are not abutted to the protrusion portion 21 of the block 300A. In addition, the right-side interlocking member 203 disposed in a certain angle position (an example of a retreat position) does not interfere with the protrusion portion 21 of the block 300A, and go into the concave portion 26 such that the right-side interlocking member 202 does not block the electronic circuit board 20A from being inserted into the second slot 122. As such, in a state where an insertion of the electronic circuit board 20C into the first slot 121 is completed, the electronic circuit board 20A may be inserted into the second slot 122.

As such, according to the examples illustrated in FIG. 16 to FIG. 20, the combination of the kinds of the electronic circuit board 20 that may be inserted into the abutted first and second slots 121 and 122 may be limited according to the combination limit table illustrated in FIG. 18. The combination limit table illustrated in FIG. 18 is just an example, and when the combination limit table is changed as described above, the structure of the blocks 300A to 300C may be changed accordingly.

According to the examples illustrated in FIG. 16 to FIG. 20, in a state where all of the first slot 121 and the second slot 122 is in an empty state, because the electronic circuit board 20 having the protrusion 21 may not be inserted into the second slot 122, the order of the insertion may be regulated.

According to the example illustrated in FIG. 16 to FIG. 20, in a state where the electronic circuit board 20 is inserted into both of the first slot 121 and the second slot 122, the electronic circuit board 20 may be extracted from any one of the first slot 121 and the second slot 122. That is, the restriction of the removal order of the electronic circuit board 20 from the abutted first and second slots 121 and 122 may be eliminated.

Figure 21:
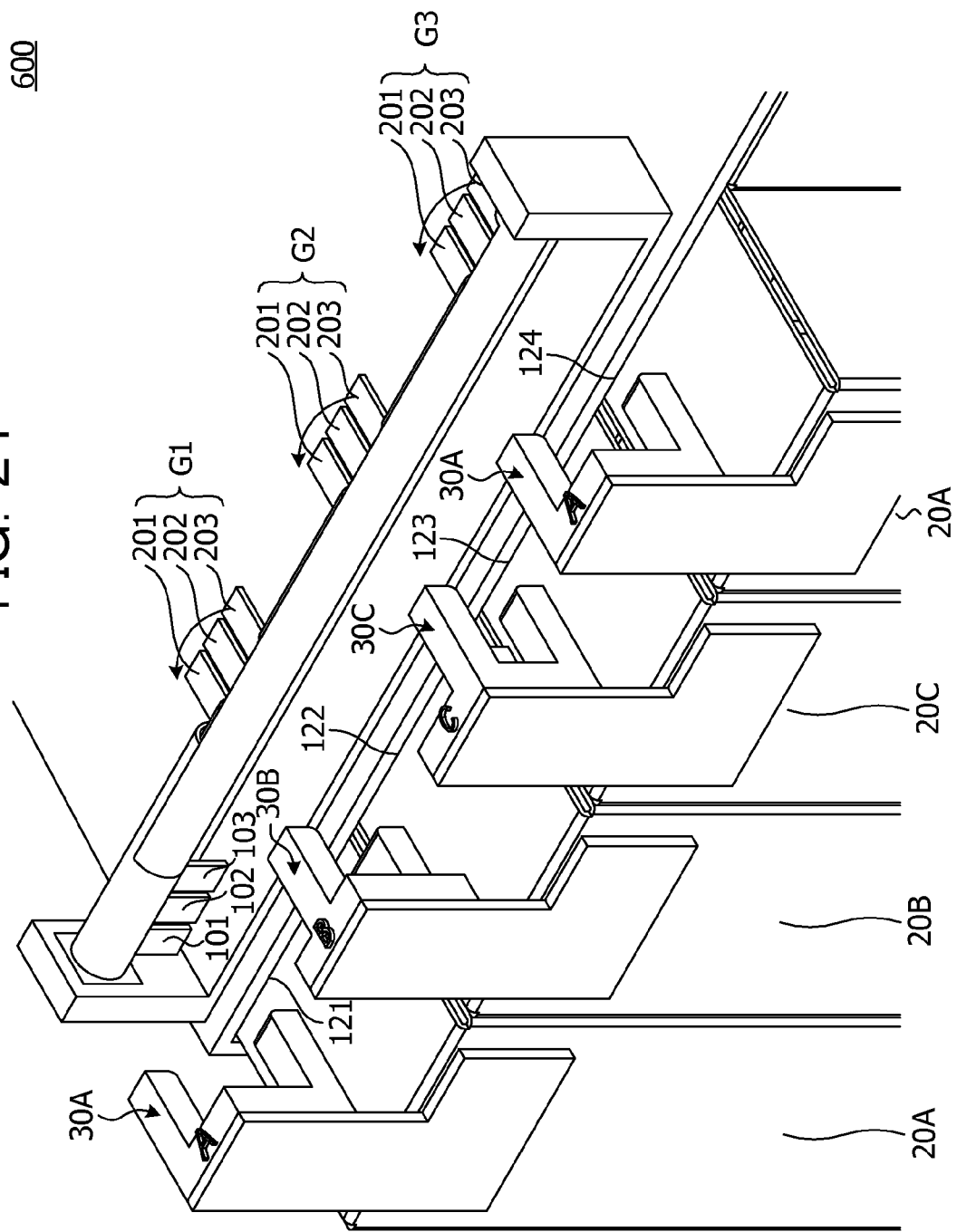
FIG. 21 is a perspective view illustrating an insertion error protection device 600 according to another exemplary embodiment (a third embodiment)

FIG. 21 is a perspective view illustrating an insertion error protection device 600 according to yet another embodiment (third embodiment). FIG. 22 is a drawing illustrating an example of a combination limit table implemented by the insertion error protection device 600.

The insertion error protection device 600 according to the third embodiment is different from the insertion error protection device 400 according to the first embodiment described above in that three sets of the left-side interlocking member 201, the center interlocking member 202, and the right-side interlocking member 203 are provided in the insertion protection device 600, instead of one set.

The left-side interlocking member 201, the center interlocking member 202, and the right-side interlocking member 203 of the first set G1 are installed against the second slot 122, and the left-side interlocking member 201, the center interlocking member 202, and the right-side interlocking member 203 of the second set G2 are installed against the third slot 123. The third slot 123 is abutted to the right-side with respect to the second slot 122. The left-side interlocking member 201, the center interlocking member 202, and the right-side interlocking member 203 of the third set G1 are installed against the fourth slot 124. The fourth slot 124 is abutted to the right-side with respect to the third slot 123.

The left-side interlocking member 201 of the second set G2 and the left-side interlocking member 201 of the third set G3 are moved in the similar manner to the left-side interlocking member 201 of the first set G1. For example, the left-side interlocking member 201 of the second set G2 and the left-side interlocking member 201 of the third set G3 may be formed by extending the length of the first key 410 as illustrated in, for example, FIG. 11. The same applies to the center interlocking member 202 of the second set G2 and the center interlocking member 202 of the third set G3, or the right-side interlocking member 203 of the second set G2 and the right-side interlocking member 203 of the third set G3.

In an example shown in FIG. 21, it is assumed that the electronic circuit board 20A having the block 30A is inserted into the first slot 121 for the first time. In this case, as described above with reference to FIG. 5, the right-side interlocking member 203 of each of the sets (G1 to G3) is rotated up to the limit position (see, e.g., the arrow of FIG. 21). Accordingly, the electronic circuit board 20C having the block 30C may not be inserted into the second slot to the fourth slot 122 to 124 (see, e.g., FIG. 22).

As such, according to an example illustrated in FIG. 21, the combination of the kind of the electronic circuit board 20 that may be inserted into the first slot 121 and the kind of the electronic circuit board 20 that may be inserted into three slots of the second slot to the fourth slot 122 to 124 abutted to the first slot 121 may be limited. In addition, the combination limit table illustrated in FIG. 21 is merely an example, and in case of changing the combination limit table as described above, the structure of the blocks 30A to 30C may be changed accordingly. In addition, in an example illustrated in FIG. 21, the three slots of the second slot to the fourth slot 122 to 124 abutted to the first slot 121 are to be targeted, but the two slots of the second slot and the third slot 122 and 123 abutted to the first slot 121 may be targeted as well. Otherwise, the four or more slots abutted to the first slot 121 may well be targeted. Or, according to an example illustrated in FIG. 21, similar effects to the examples illustrated in FIG. 3 to FIG. 8 may be obtained.

In addition, plural sets of the left-side interlocking member 201, the center interlocking member 202, and the right-side interlocking member 203 may be provided with regard to the insertion error protection device 500 according to the second embodiment as described above, following similar logics to the insertion error protection device 600.

Figure 23:
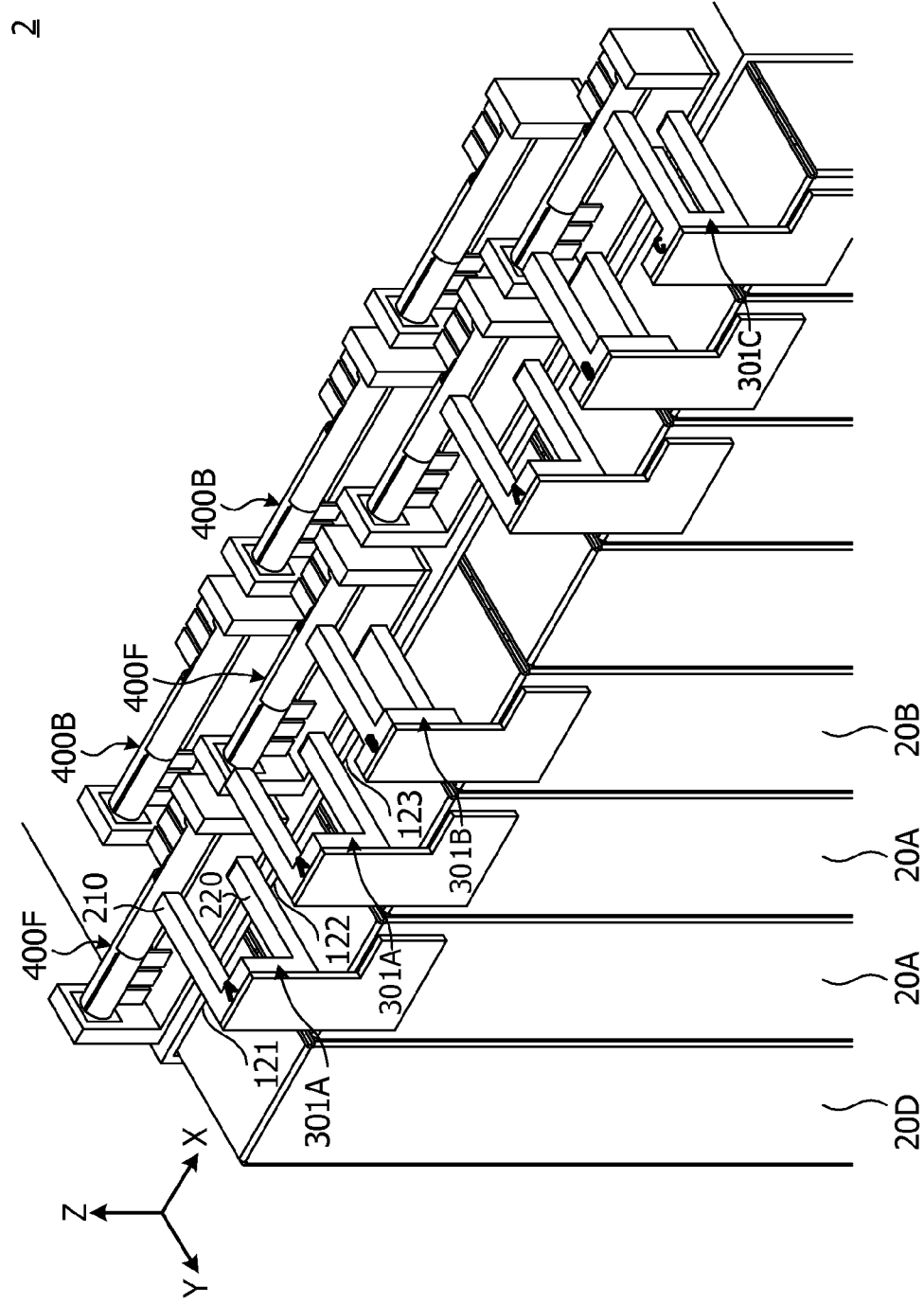
FIG. 23 is a perspective view illustrating the electronic device 2 according to another example.

FIG. 23 is a perspective view illustrating the electronic device 2 according to another example. As compared with the electronic device 1 described above, the electronic device 2 is different in that two of the insertion error protection devices 400 are provided for a single slot 12. That is, in the electronic device 2, a plurality of insertion error protecting devices 400 is provided in the second column which is offset in the X direction and the Y direction. Herein, for convenience, the insertion error protection device 400 of the front side in Y direction is referred to as the insertion error protection device 400F, and the insertion error protection device 400 of the depth side in the Y direction is referred to as the insertion error protection device 400B.

As compared with the blocks 30A to 30C described above, the structure of the blocks 301A to 301C is different in that the protrusion portion 21 and the pressing portion 22 are replaced with the abutment portion 210 and the pressing portion 220, respectively. The abutment portion 210 and the pressing portion 220 are a structure that the length of the Y direction of the protrusion portion 21 and the pressing portion 22 is elongated. The length of the Y direction of the abutment portion 210 and the pressing portion 220 is determined such that the abutment portion 210 and the pressing portion 220 may act on the insertion error protection device 400B of the depth side in the Y direction.

According to an example shown in FIG. 23, it is possible to limit not only a combination of kinds of the electronic circuit board 20 that may be inserted into the abutted first and second slots 121 and 122, but also a combination of kinds of the electronic circuit board 20 that may be inserted into the abutted second and third slots 122 and 123. As such, it is possible to limit the kind of the electronic circuit board 20 that may be inserted into certain slots 12 to a relationship with the kind of the electronic circuit board 20 that may be inserted into each slot 12 abutted to the left and right of the slot 12.

In addition, in an example shown in FIG. 23, the electronic circuit board 20D is not equipped with any block 30. The electronic circuit board 20D does not select the kind of the electronic circuit board 20 that may be inserted into the abutted slot 12. As such, there may be the electronic circuit board 20D that is not equipped with the block 30. That is, the electronic device 2 may include the electronic circuit board 20D that is not equipped with the block 30. The same applies to the electronic device 1 described above.

As described above, while each embodiment has been described, the present disclosure is not limited to the specific embodiments, but various modifications and alternations may be made in the scope described in claims. In addition, all or a plurality of elements of the embodiments described above may be combined.

For example, in the embodiments described above, even though the three abutment members in the left-side abutment member 101, the center abutment member 102, and the right-side abutment member 103 are provided, any one of the three abutment members may well be omitted. In this case, the interlocking member among the left-side interlocking member 201, the center interlocking member 202, and the right-side member 203 corresponding to the omitted abutment member may be omitted.

Alternatively, four or more abutment members and interlocking members may be set. In any circumstances, any two abutment members among more than two abutment members become each example of the first abutment member and the second abutment member, and each interlocking member that is interlocked with the two abutment members becomes each example of the first interlocking member and the second interlocking member. In addition, any three abutment members among more than three abutment members become each example of the first abutment member and the third abutment member, and each interlocking member that is interlocked with the three abutment members becomes each example of the first interlocking member and the third interlocking member.

In addition, in the embodiments described above, while each kind of the electronic circuit board 20, except for the electronic circuit board 20D described above, has both of the protrusion portion 21 and the pressing portion 22, there may be the electronic circuit board having only one of the protrusion portion 21 and the pressing portion 22. For example, the electronic circuit board 20 designed to be inserted only into the first slot 121 may not have the protrusion portion 21.

Alternatively, for a case of the insertion error protection device 500, the electronic circuit board 20 of a kind designed to be inserted only into the first slot 121 may have the protrusion portion 21 at all of the three sections (left, right, center). Alternatively, for a case of the insertion error protection device 500, the electronic circuit board 20 of a kind designed to be inserted only into the first slot 121 may do not have both of the protrusion portion 21 and the concave portion 26. Similarly, the electronic circuit board 20 of a kind designed to be inserted only into the second slot 121 may do not have the pressing portion 22.

In addition, in the embodiments described above, the left-side abutment member 101, the center abutment member 102, the right-side abutment member 103, the left-side interlocking member 201, the center interlocking member 202, and the right-side member 103 may be arranged at an opposite side of the upper and lower side with respect to the axis 90. Accompanying this, the protrusion portion 21 and the pressing portion 22 (the same for the abutment portion 210 and the pressing portion 220) may be arranged at an opposite side of the upper and lower side with respect to the axis 90.

In addition, in the embodiments described above, the protrusion portion 21 and the pressing portion 22 (the same for the abutment portion 210 and the pressing portion 220) are formed with the common three sections (left, right, center), but the present disclosure is not limited thereto. For example, the three sections where the protrusion portion 21 is formed and the three sections where the pressing portion 22 is formed may be such that the position of the X direction is offset. Also, the three sections where the pressing portion 22 is formed are the examples of the first position, the second position, and the fifth position of the X direction, and the three sections where the protrusion portion 21 is formed are the examples of the third position, the fourth position, and the sixth position of the X direction.

In addition, in the embodiments described above, the left-side abutment member 101, the center abutment member 102, the right-side abutment member 103, the left-side interlocking member 201, the center interlocking member 202, and the right-side interlocking member 203 may be rotated along the common axis 90, but the present disclosure is not limited thereto. For example, the rotation axis in the left-side abutment member 101, the center abutment member 102, and the right-side abutment member 103, and the rotation axis of the left-side interlocking member 201, the center interlocking member 202, and the right-side interlocking member 203 may not be a coaxial.

In addition, in the embodiments described above, even though the electronic devices 1 and 2 form an optical transmission device, other use may well be conceived. For example, the electronic devices 1 and 2 may be a server type, and in this case, the shelf 10 may be a rack type. In this case, the electronic circuit board 20 may be mounted on each end of the rack (corresponds to the slot 12). In this case, for example, a PSU (Power Supply Unit), a mother board, an HDD (hard disk drive) may be mounted on the electronic circuit board 20.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
a shelf where a first slot and a second slot are formed to be abutted with each other in a first direction;
a plurality of kinds of electronic circuit boards inserted into any one of the first slot and the second slot, and when a vertical direction against both of the first direction and a direction in which the electronic circuit boards are inserted into the first slot is defined as a second direction, including a first-side protrusion portion installed at a first-side of the second direction and a second-side protrusion portion installed at a second-side that is different from the first-side of the second direction, and an arrangement pattern of the first-side protrusion portion and the second-side protrusion is different from each other;
a first abutment member installed against the first slot and rotatable around an axis of the first direction, and when an electronic circuit board of a kind having the first-side protrusion portion at the first position of the first direction is inserted into the first slot with the second slot is in an empty state, configured to abut the first-side protrusion portion of the first position and rotate from a first angle position to a second angle position;
a second abutment member installed against the first slot and rotatable around an axis of the first direction, and when an electronic circuit board of a kind having the first-side protrusion portion at a second position different from the first position of the first direction is inserted into the first slot with the second slot is in an empty state, configured to abut the first-side protrusion portion of the second position and rotate from the first angle position to the second angle position;
a first interlocking member installed against the second slot and rotating around an axis of the first direction either from a limit position to a retreat position or from the retreat position to the limit position, when in the retreat position and when an arbitrary electronic circuit board among the plurality of circuit boards is inserted into the second slot, configured not to interfere with the second-side protrusion portion of the arbitrary electronic circuit board, and when in the limit position and when an electronic circuit board of a kind having the second-side protrusion portion at a third position of the first direction is inserted into the second slot, configured to interfere with the second-side protrusion portion of the third position and block an insertion of the electronic circuit board of a kind having the second-side protrusion portion of the third position into the second slot; and
a second interlocking member installed against the second slot and rotating around the axis of the first direction from the limit position to the retreat position or from the retreat position to the limit position by interlocking with a rotation of the second abutment member from the first angle direction to the second angle direction, when in the retreat position and when an arbitrary electronic circuit board among the plurality kinds of circuit boards is inserted into the second slot, configured not to interfere with the second-side protrusion portion of the arbitrary electronic circuit board, and when in the limit position and when an electronic circuit board of a kind having the second-side protrusion portion at a fourth position different from the third portion of the first direction is inserted into the second slot, configured to interfere with the second-side protrusion portion of the fourth position and block an insertion of the electronic circuit board of a kind having the second-side protrusion portion at the fourth position into the second slot.

2. The electronic device according to claim 1, wherein each of the axis of the first direction according to the first abutment member, the second abutment member, the first interlocking member, and the second interlocking member is common, and wherein when seen in a state where the electronic circuit board is inserted into the first slot, the first-side protrusion portion is positioned at the first-side with respect to the axis of the first direction from the second direction, and the second-side protrusion portion is positioned at the second-side with respect to the axis of the first direction in the second direction.

3. The electronic device according to claim 1, wherein the first abutment member and the second abutment member are installed to be abutted in the first direction;

wherein when seen in a state where the electronic circuit board is inserted into the first slot, the first-side protrusion portion of the first position is in the same position as the first abutment member in the first direction, and the first-side protrusion portion of the second position is in the same position as the second abutment member in the first direction;

wherein the first interlocking member and the second interlocking member are installed to be abutted in the first direction; and wherein when seen in a state where the electronic circuit board is inserted into the second slot, the second-side protrusion portion of the third position is in the same position as the first interlocking member in the first direction, and the second-side protrusion portion of the fourth position is in the same position as the second interlocking member in the first direction.

4. The electronic device according to claim 1, wherein the first abutment member and the first interlocking member are formed with a first tube member of a tube shape, and wherein the second abutment member and the second interlocking member are formed in a second tube member of a tube shape that is installed as an overlapped aspect in the first tube member after passing through an inner diameter side of the first tube member.

5. The electronic device according to claim 1, further comprising a plurality kinds of blocks equipped with the first-side protrusion portion and the second-side protrusion portion each with a different arrangement pattern, and wherein each kind of the plurality of electronic circuit boards is attached with a different kind of the block.

6. The electronic device according to claim 5, wherein the blocks include a concave portion extended in the first direction between the first-side and the second-side of the second direction, and when the electronic circuit board having the blocks is inserted into the second slot, the concave portion is formed to receive the first interlocking member and the second interlocking member disposed in the retreat position.

7. The electronic device according to claim 1, wherein the first position of the first direction for the first-side protrusion portion is the same as the third position of the first direction for the second-side protrusion portion, and the second position of the first direction for the first-side protrusion portion is the same as the fourth position of the first direction for the second-side protrusion portion.

8. The electronic device according to claim 1, further comprising:

a third abutment member installed against the first slot and rotatable around the axis of the first direction, and when a kind of electronic circuit board having the first-side protrusion portion at a fifth position different from the first position and the second position of the first direction is inserted into the first slot with the second slot in an empty state, configured to abut the first-side protrusion portion of the fifth position and rotate from the first angle position to the second angle position; and a third interlocking member installed against the second slot and rotating around the axis of the first direction from the limit position to the retreat position or from the retreat position to the limit position by interlocking with a rotation of the third abutment member from the first angle position to the second angle position, when in the retreat position and when an arbitrary electronic circuit board among the plurality kinds of circuit boards is inserted into the second slot, configured not to interfere with the second-side protrusion portion of the arbitrary electronic circuit board, and when in the limit position and when an electronic circuit board of a kind having the second-side protrusion portion at a sixth position different from the third position and the fourth position of the first direction is inserted into the second slot, configured to interfere with the second-side protrusion portion at the sixth position and block an insertion of the electronic circuit board having the second-side protrusion portion at the sixth position into the second slot.

9. The electronic device according to claim 1, wherein any one of the plurality of electronic circuit boards only includes any one of the first-side protrusion portion and the second-side protrusion portion.

10. The electronic device according to claim 1, in addition to the plurality of electronic circuit boards, further comprising an electronic circuit board of a kind that does not have any one of the first-side protrusion portion and the second-side protrusion portion.

11. An insertion error protection device comprising:

a plurality of abutment members installed against a first slot in a shelf where a first slot and a second slot are formed to be abut in a first direction, and when an electronic circuit board is inserted into the first slot with a state where the second slot is in an empty state, configured to abut the electronic circuit board with a different pattern according to a kind of the electronic circuit board, and only abutment members abut with each other rotate around an axis of the first direction from a first angle position to the second angle position; and a plurality of interlocking members installed against the second slot corresponding to each of the plurality of abutment members, configured to rotate around an axis of the first direction from a limit position to a retreat position or from the retreat position to the limit position by coupling with a rotation of a corresponding abutment member from the first angle position to the second angle position, and configured to be able to be inserted into the second slot according to a pattern of an interlocking member disposed in the limit position.

12. An electronic device comprising:

a shelf where a first slot and a second slot are formed to be abutted in a first direction;

a plurality of abutment members installed against a first slot in a shelf, and when an electronic circuit board is inserted into the first slot with a state where the second slot is in an empty state, configured to abut the electronic circuit board with a different pattern according to a kind of the electronic circuit board, and only abutment members abut with each other rotate around an axis of the first direction from a first angle position to the second angle position; and a plurality of interlocking members installed against the second slot corresponding to each of the plurality of abutment members, configured to rotate around an axis of the first direction from a limit position to a retreat position or from the retreat position to the limit position by coupling with a rotation of a corresponding abutment member from the first angle position to the second angle position, and configured to be able to be inserted into the second slot according to a pattern of an interlocking member disposed in the limit position.

* * * * *